United States Patent
Hallquist (10) Patent No.: US 9,607,115 B2
(45) Date of Patent: Mar. 28, 2017

(54) METHODS AND SYSTEMS FOR REPORTING REALISTIC KINETIC ENERGY OF A MULTI-PART FINITE ELEMENT ANALYSIS MODEL

(71) Applicant: Livermore Software Technology Corporation, Livermore, CA (US)

(72) Inventor: John O. Hallquist, Livermore, CA (US)

(73) Assignee: Livermore Software Technology Corp., Livermore, CA (US)

(*) Notice: Subject to any disclaimer, the term of this patent is extended or adjusted under 35 U.S.C. 154(b) by 794 days.

(21) Appl. No.: 14/089,529

(22) Filed: Nov. 25, 2013

(65) Prior Publication Data
US 2015/0149129 A1     May 28, 2015

(51) Int. Cl.
*G06F 17/50* (2006.01)

(52) U.S. Cl.
CPC ............... *G06F 17/5018* (2013.01)

(58) Field of Classification Search
None
See application file for complete search history.

(56) References Cited

U.S. PATENT DOCUMENTS

| | | | |
|---|---|---|---|
| 2007/0016388 A1* | 1/2007 | Shimel | G06F 17/5018 703/1 |
| 2007/0282571 A1* | 12/2007 | Rassaian | G06F 17/5018 703/2 |
| 2011/0093240 A1* | 4/2011 | Hallquist | G06F 17/5018 703/1 |
| 2012/0323536 A1* | 12/2012 | Borrvall | G06F 17/5018 703/1 |

OTHER PUBLICATIONS

Danyluk, "An Analysis of Multi-Material Plates Under Explosive Loading", An Engineering Project for the degree of Master of Engineering, Rensselaer Polytechnic Institute at Hartford, Dec. 2010, 64 pages.*

* cited by examiner

*Primary Examiner* — Omar Fernandez Rivas
*Assistant Examiner* — Herng-Der Day
(74) *Attorney, Agent, or Firm* — Roger H. Chu (57) ABSTRACT

Techniques for reporting realistic kinetic energy of a multi-part FEA model are disclosed. FEA model representing a product is received. The product contains more than one parts, each part comprises multiple finite elements. Nodal lumped masses are defined therein to ensure a realistic mass distribution. Kinetic energy of the nodal lumped masses shared by multiple parts is acutely computed for the shared parts. Each of the nodal lumped masses is allocated and accumulated into respective portions as an added mass contribution in accordance with a set of predefined rules for various sharing situations of the finite elements that share the nodal lumped mass. Numerically-simulated structural responses are obtained by conducting a time marching simulation using the FEA model. Finally, kinetic energy of each finite element is reported; calculated using the obtained structural responses, the element mass, and the corresponding added mass contribution from the nodal lumped masses.

9 Claims, 6 Drawing Sheets

METHODS AND SYSTEMS FOR REPORTING REALISTIC KINETIC ENERGY OF A MULTI-PART FINITE ELEMENT ANALYSIS MODEL

FIELD OF THE INVENTION

The present invention generally relates to computer aided engineering analysis, more particularly to methods and systems for reporting realistic kinetic energy of a multi-part finite element analysis (FEA) model.

BACKGROUND

Computer aided engineering (CAE) has been used for supporting engineers in many tasks. For example, in a structure or product design procedure, CAE analysis, in particular finite element analysis (FEA), has often been employed to obtain simulated structural responses (e.g., stresses, displacements, etc.) under various loading conditions (e.g., static or dynamic).

As computer technologies improved over the past years, FEA models have become more sophisticated. For example, simulation results of modern FEA models are expected to accurately represent the center-of-mass not only for the complete vehicle, but for each part of the vehicle, such as the vehicle floorboard with carpet and fasteners attached. Likewise, all additional parts defining the vehicle, typically in the hundreds, are expected to be accurately modeled including their centers-of-mass. A prior art approach has been to model the mass of the carpet and fasteners as nodal masses and report kinetic energy from the simulation results separately for the nodal masses and the vehicle floor. Afterwards, the two kinetic energies are combined to obtain the total kinetic energy of the floorboard with carpet and fasteners. Another prior art approach defines a mass per unit area for the carpet layer over the vehicle floor, which then augments the mass of the part to account for the carpet layer. The latter approach is generally avoided since the center-of-mass of the part cannot be as accurately controlled as it can when defining nodal masses. Large vehicle models may contain well over 100,000 nodal lumped masses. The prior art approach is acceptable when all nodal masses used to augment the mass of the part belong to nodes that are unique to the part. In this case the summation of the lumped mass nodal kinetic energy and the part kinetic energy gives the kinetic energy value of interest to the designer; however, if a particular node k having a lumped mass shared by two or more parts, the kinetic energy calculations for the part will be too large since the entire lumped mass of node k and the resultant kinetic energy is added to the part kinetic energy. The latter is true for every part that shares node k. Generally, the kinetic energy calculations for parts are incorrect for every part in the model where a nodal lumped mass is attached to a part node shared by multiple parts. Another possible source of error in the kinetic energy calculation appears when an element of a part fails and is deleted or when an entire part is deleted. In this latter case, if the element has a node, which is assigned a lumped mass, the kinetic energy for the portion of the lumped mass attributed to the failed element or deleted part should be excluded from the kinetic energy of the part.

It would, therefore, be desirable to have computationally efficient methods and systems for automatically reporting correct kinetic energy of a part where a subset of nodes of the part receiving lumped masses are shared by one or more additional parts and when failed elements and deleted parts have attributed lumped mass.

SUMMARY

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for reporting realistic kinetic energy of a multi-part finite element analysis (FEA) model are disclosed. According to one aspect of the present invention, a FEA model representing a product is received in a computer system having a FEA application module installed thereon. The product contains more than one parts, each part comprises one or more finite elements. One or more nodal lumped masses are defined therein to ensure a realistic mass distribution. Each of the nodal lumped masses is allocated and accumulated into respective portions as an added mass contribution in accordance with a set of predefined rules for various sharing situations of the finite elements that share the nodal lumped mass. Numerically-simulated structural responses (e.g., nodal velocities) are obtained by conducting a time marching simulation using the FEA model. Finally, kinetic energy of each finite element is reported; calculated using the obtained structural responses, the element mass, and the corresponding added mass contribution. Since the added mass contribution for each finite element is realistically allocated, the calculated total kinetic energy will correspond to a realistic physical value.

Objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-6. However, those skilled in the art will readily appreciate that the detailed description given herein with respect to these figures is for explanatory purposes as the invention extends beyond these limited embodiments.

Figure 1:
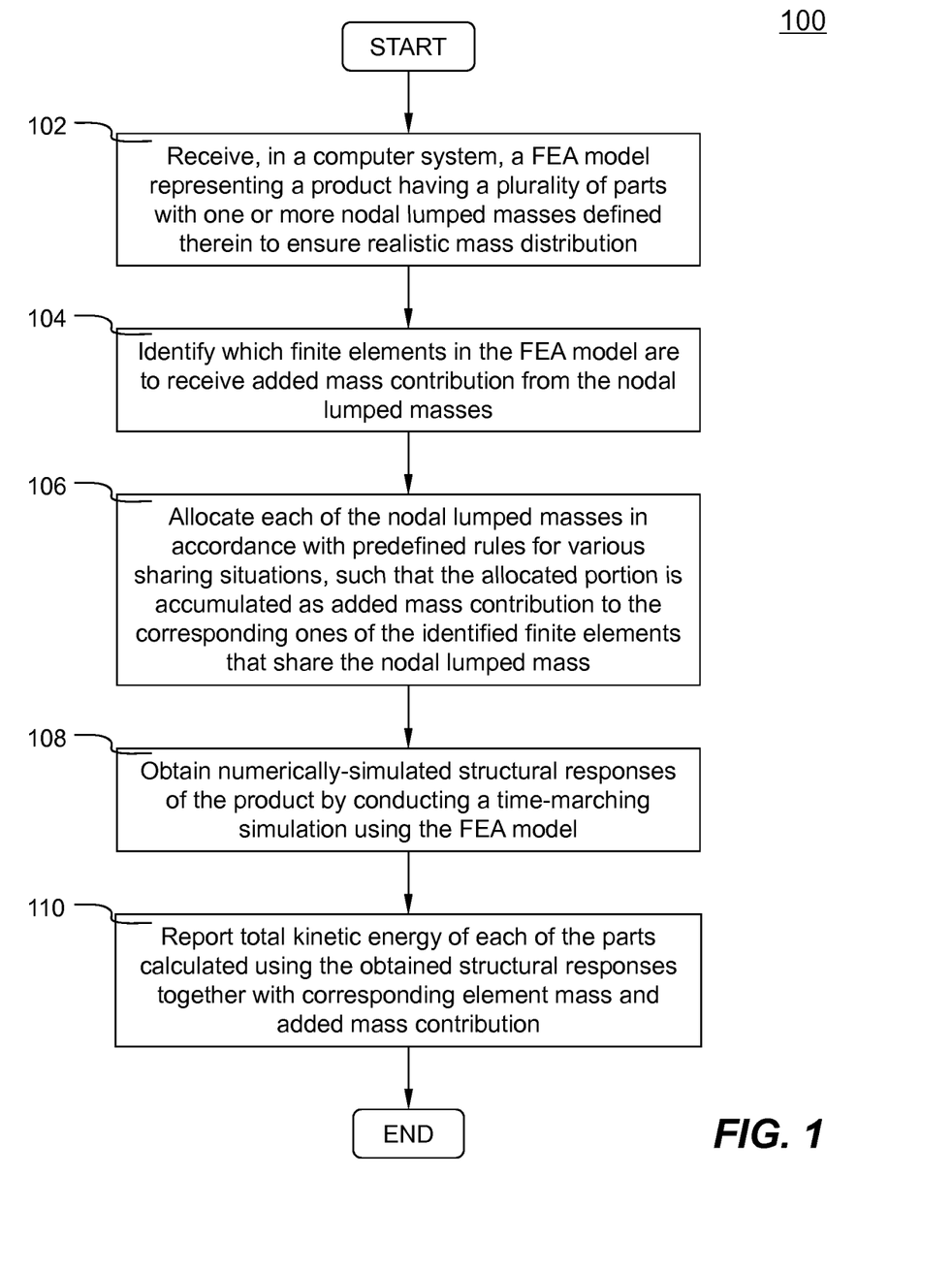
FIG. 1 is a flowchart illustrating an exemplary process of reporting realistic kinetic energy of a multi-part finite element analysis (FEA) model, according to an embodiment of the present invention.

Referring first to FIG. 1, it is shown a flowchart illustrating an exemplary process 100 of reporting realistic kinetic energy of a multi-part finite element analysis (FEA) model in accordance with one embodiment of the present invention. The present invention is preferably implemented in software and understood with other figures, for example, FIGS. 2-6.

Figure 2:
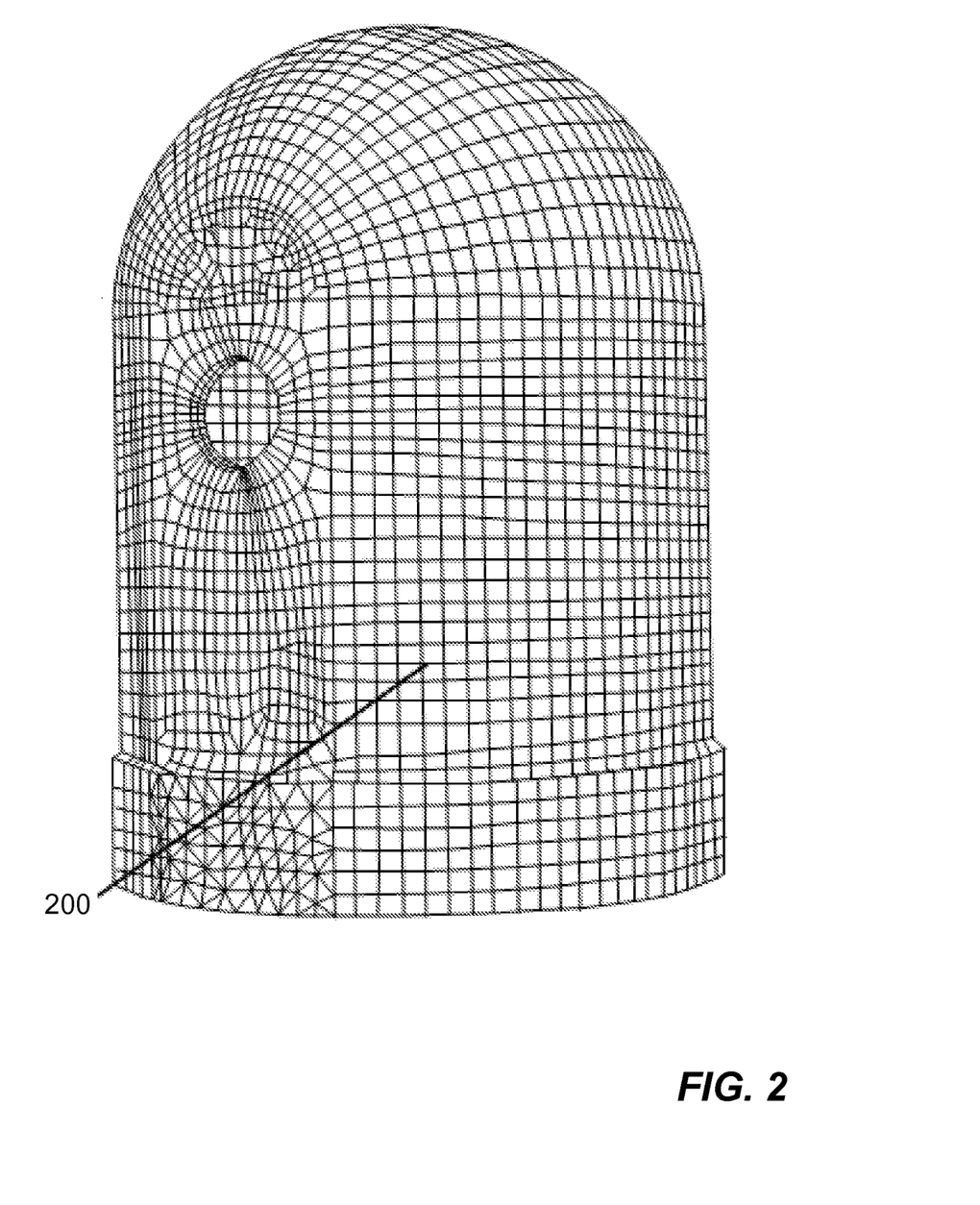
FIG. 2 is a diagram showing an exemplary finite element analysis (FEA) model.

Process 100 starts by receiving a FEA model representing a product in a computer system (e.g., computer 600 of FIG. 6) having a FEA application module installed thereon at step 102. Any product can be represented by a FEA model, for example, an automobile. An exemplary finite element analysis (FEA) model 200 is shown in FIG. 2. The product includes more than one parts (e.g., car may include doors, hood, fender, carpet, seats, etc.). Each part is represented by one or more finite elements (e.g., beam elements, shell elements, solid elements, etc.). And each finite element is associated with a mass density for calculating element mass using the following formula:

$$m_k = \text{(element volume)} \cdot \text{(element density)}$$

Figure 3:
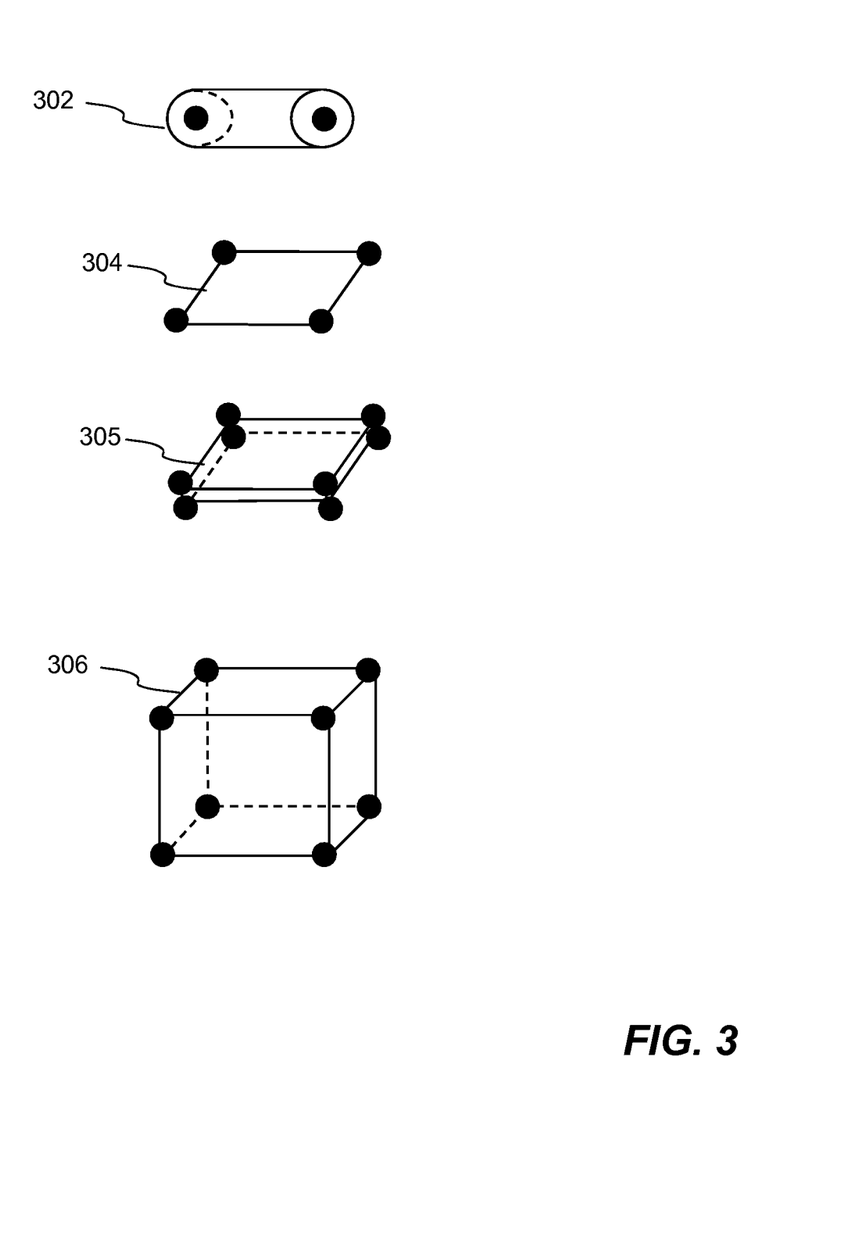
FIG. 3 is a diagram showing various exemplary finite elements.

For example, a beam element 302 shown in FIG. 3, element mass $m_k$ is the mass density multiplied by the volume (i.e., cross-section area×length). Similarly, element mass $m_k$ of the thin shell element 304 is the mass density multiplied by the volume (i.e., thickness×area), the element mass $m_k$ of the thick shell element 305 and the element mass $m_k$ of the solid element 306 is the mass density multiplied by the volume of the solid element.

Figure 4:
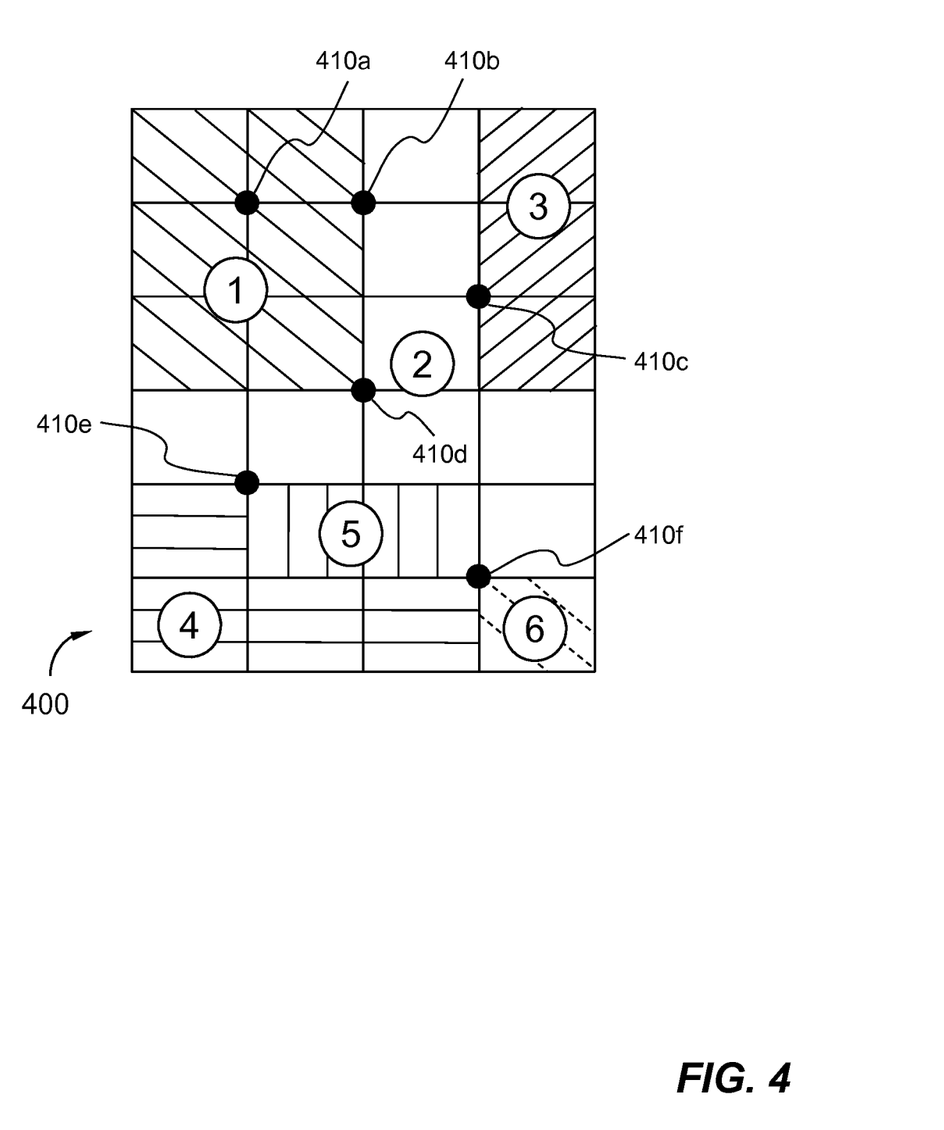
FIG. 4 is a diagram showing an exemplary portion of finite element analysis multi-part model with a number of nodal masses defined therein, according to an embodiment of the present invention.
Figure 5A:
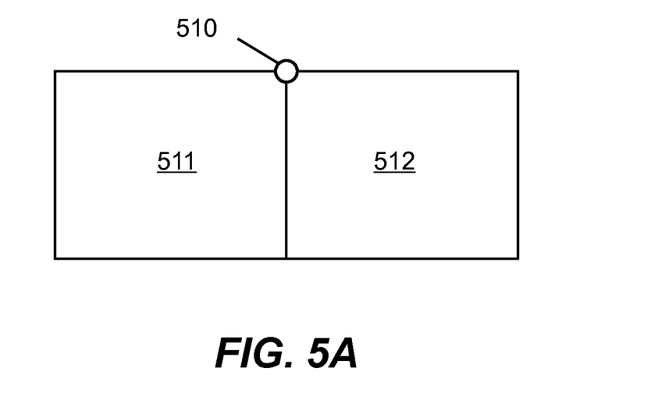
FIGS. 5A-5C are schematic diagrams showing various exemplary nodes being shared by more than one finite elements, according to an embodiment of the present invention.
Figure 5B:
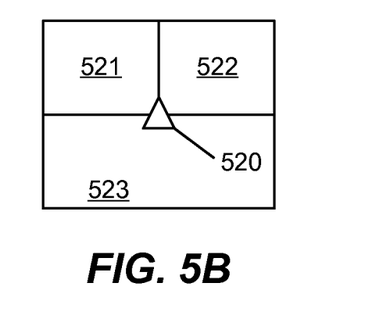
Figure 5C:
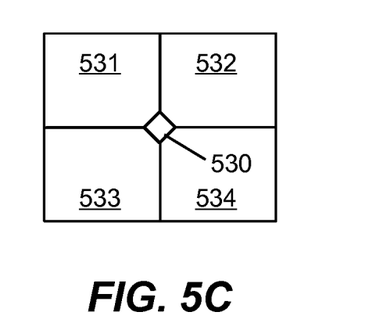

In addition, one or more nodal lumped masses are included in the FEA model to ensure realistic mass distribution of certain portion of the product (e.g., floorboard and fasteners of an automobile). FIG. 4 shows a portion of an exemplary multi-part FEA model 400 that contains a number of nodal lumped masses 410a-410f. In the example, there are six parts (shown with different patterns, each denoted with a circled number). In order to report correct kinematic energy of each part, each of the nodal lumped masses must be included in the corresponding part. For a nodal lumped mass located at the part boundary, a correct percentage or portion of the nodal lumped mass must be attributed to each of the parts that shares the node.

Next, at step 104, all of the finite elements receiving added mass contributions are identified. In one embodiment, it is done by checking each nodal point ID defining a particular finite element to see if the same nodal point ID has an associated nodal lumped mass defined in the FEA model. Computer storage is allocated for those identified finite elements for recording the added mass contribution. This allows compacted storage since the added mass contribution is only stored for those identified finite elements. As a result, the computation time required to initialize storage for the added mass contribution is reduced since only the identified finite elements are checked.

At step 106, each of the nodal lumped masses is processed for allocating respective portions to be contributed to the identified finite elements that share the nodal point associated with the nodal lumped mass.

According to one embodiment, a particular one of the identified finite elements may receive an added mass contribution from one or more nodal lumped masses defined in the FEA model. Before looping over the nodal lumped masses, an array of added mass contributions to all identified finite elements is initialized to zero. While looping over the defined nodal lumped masses, the total added mass contribution for each of the identified finite element is calculated. For each nodal lumped mass, Mc, the mass is distributed to the finite elements sharing the node point ID associated with the nodal lumped mass. The added mass contribution, $m_{added}$, is proportional to the element mass. For example if a nodal lumped mass at node point ID is shared by n elements, the added mass contribution for the kth element in the list of n finite elements is calculated with the following formulas:

$$m_k = \text{(element volume)} \cdot \text{(element density)}$$

$$m_{added} = Mc \left( \frac{m_k}{m_1 + m_2 + m_3 + \ldots + m_{n-1} + m_n} \right)$$

$$m_{attributed\ mass\ to\ kth\ element} = m_{attributed\ mass\ to\ kth\ element} + m_{added}$$

This approach accommodates a multiplicity of element types such as beams, solids, shells, and thick shells. With this approach it is not necessary to know if a lumped mass contributes to one or more parts, since the treatment of boundary nodes and interior nodes is identical.

The distribution schemes can be shown as various sharing situations. For example, in a first sharing situation shown in FIG. 5A, a nodal lumped mass 510 may be divided evenly between two different finite elements 511 and 512. Applying the aforementioned formula as an example, $m_{added}$ for element 511 equals the nodal lumped mass 510 multiplied by element mass of element 511 divided by the total mass of elements 511 and 512. In the second situation shown in FIG. 5B, a nodal lumped mass 520 may be divided into three portions to be allocated to finite elements 521, 522 and 523. Finally, in the third sharing situation shown in FIG. 5C, a nodal lumped mass 530 is shared among finite elements 531, 532, 533 and 534.

After all of the nodal lumped masses have been properly allocated, numerically-simulated structural responses of the product are obtained by conducting a time-marching simulation using the FEA model at step 108. The numerically-simulated structural responses include nodal velocities and element status (e.g., failure) at each solution cycle of the time-marching simulation.

Finally, at step 110, total kinetic energy of each part is calculated using the numerically-simulated structural responses together with corresponding element masses and the added mass contribution. Then the resulting total kinetic energy for each part is reported to the user (e.g., scientist, engineer, etc.). Since the added mass contribution for each finite element is realistically allocated, the calculated total kinetic energy will correspond to a realistic physical value.

According to an embodiment, the kinetic energy, K.E, for a particular part is calculated by summing the kinetic energy of all finite elements (e.g., the number of element is p in this example) representing the particular part using the following formulas:

$$K.E. = \frac{1}{2}\sum_{1}^{p} f^e M_e V_e^2$$

$$f^e = \begin{bmatrix} 1.0 \text{ for active element} \\ 0.0 \text{ for failed element} \end{bmatrix}$$

$$M_e = m_{element\ mass} + m_{attributed\ lumped\ mass}$$

$$V_e = \frac{1}{n}\sum v_{node}$$

where n is the number of nodal points in finite element e and $v_{node}$ is the nodal velocity. With this approach failed elements are automatically deleted for the kinetic energy calculations.

Figure 6:
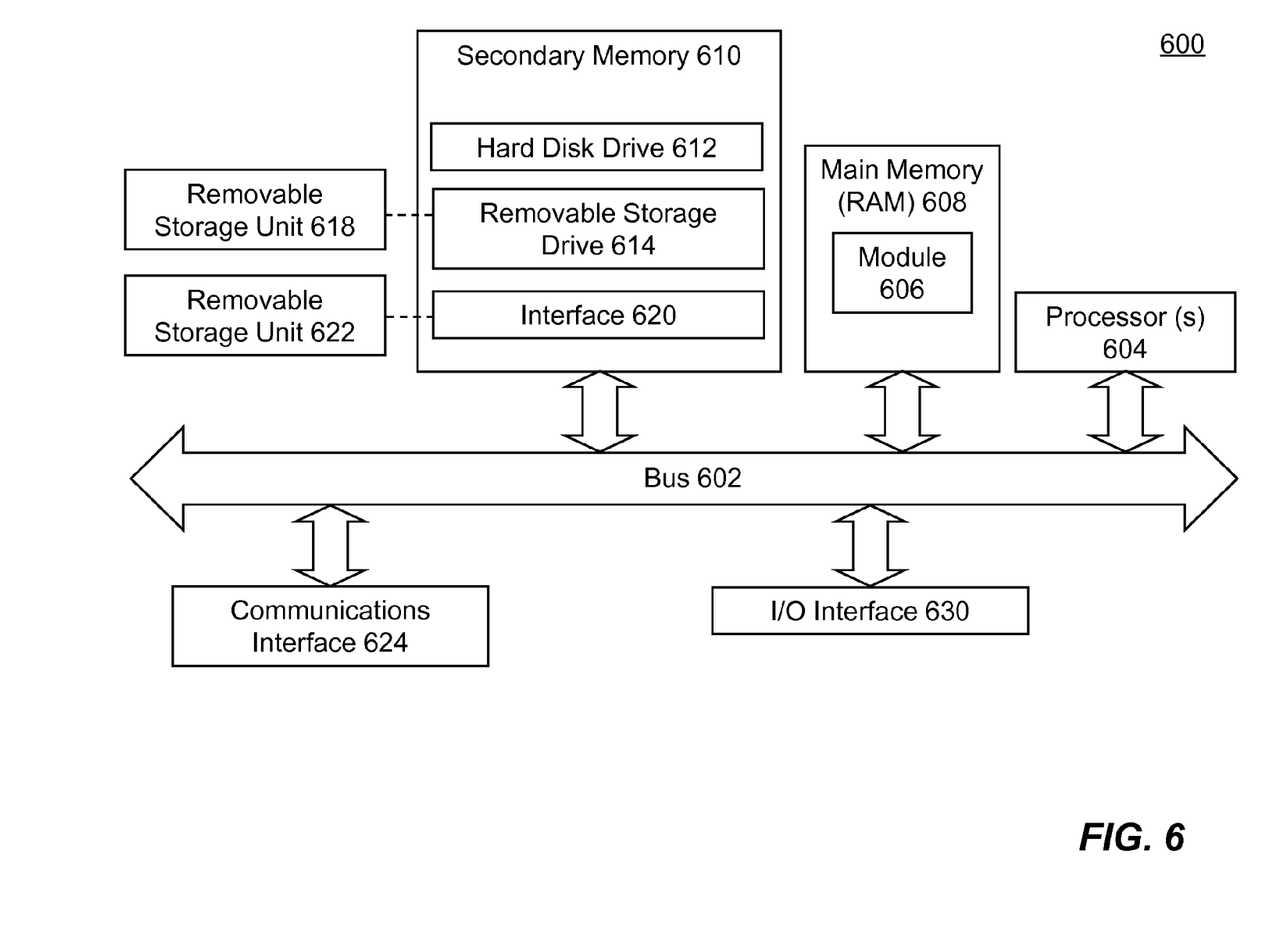
FIG. 6 is a function diagram showing salient components of an exemplary computer system, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer readable medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc.

The computer 600 communicates with other computing devices over a data network based on a special set of rules (i.e., a protocol). One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600.

In this document, the terms "computer recordable storage medium", "computer recordable medium" and "computer readable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with one or more application modules 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). The status of the time-marching simulation (e.g., simulation results, etc.) is reported to the user via the I/O interface 630 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the predefined rules have been shown and described to be based on element masses. Other means can be used instead, for example, using the number of finite elements that share the nodal lumped mass. Further, few exemplary contribution weighting factors have been shown and described. Other schemes may be used for achieving the same. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method of reporting realistic kinetic energy of a multi-part finite element analysis (FEA) model, the method comprising:
receiving a finite element analysis (FEA) model in a computer system having a FEA application module installed thereon, the FEA model representing an automobile having a plurality of parts with one or more nodal lumped masses defined therein to ensure realistic mass distribution, wherein the FEA model contains a plurality of finite elements, each of the parts is represented by at least one finite element, and each of the finite elements is associated with an element mass;
identifying, by the FEA application module, which finite elements in the FEA model are to receive one or more added mass contributions from the defined nodal lumped masses;
allocating, by the FEA application module, each of the nodal lumped masses into a plurality of portions in accordance with predefined rules for various sharing situations of the identified finite elements, such that said allocated portions are accumulated as a corresponding added mass contribution to respective ones of the identified finite elements that share said each of nodal lumped masses, wherein the predefined rules are based on a ratio of the element mass and a sum of element masses of all finite elements that share said each of the nodal lumped masses;
obtaining, by the FEA application module, numerically-simulated structural responses of the automobile by conducting a time-marching simulation using the FEA model having the added mass contribution included in the identified finite elements, the structural responses including nodal velocities at each solution cycle; and
reporting, by the FEA application module, a total kinetic energy of said each of the parts by summing up kinetic energy of all finite elements representing said each of the parts, the kinetic energy of each of the finite elements is calculated using the obtained structural responses together with the corresponding element mass and the added mass contribution for said each of the finite elements.

2. The method of claim 1, wherein the element mass is calculated by multiplying element density with element volume.

3. The method of claim 1, wherein said identifying which finite elements in the FEA model are to receive one or more added mass contributions from the defined nodal lumped masses further comprises checking each nodal point ID defining each of the finite elements to determine whether said each nodal point ID has one of the nodal lumped massed defined.

4. A system for reporting realistic kinetic energy of a multi-part finite element analysis (FEA) model, the system comprising:
a main memory for storing computer readable code for a finite element analysis (FEA) application module;
at least one processor coupled to the main memory, said at least one processor executing the computer readable code in the main memory to cause the FEA application module to perform operations by a method of:
receiving a finite element analysis (FEA) model, the FEA model representing an automobile having a plurality of parts with one or more nodal lumped masses defined therein to ensure realistic mass distribution, wherein the FEA model contains a plurality of finite elements, each of the parts is represented by at least one finite element, and each of the finite elements is associated with an element mass;
identifying which finite elements in the FEA model are to receive one or more added mass contributions from the defined nodal lumped masses;
allocating each of the nodal lumped masses into a plurality of portions in accordance with predefined rules for various sharing situations of the identified finite elements, such that said allocated portions are accumulated as a corresponding added mass contribution to respective ones of the identified finite elements that share said each of nodal lumped masses, wherein the predefined rules are based on a ratio of the element mass and a sum of element masses of all finite elements that share said each of the nodal lumped masses;
obtaining numerically-simulated structural responses of the automobile by conducting a time-marching simulation using the FEA model having the added mass contribution included in the identified finite elements, the structural responses including nodal velocities at each solution cycle; and
reporting a total kinetic energy of said each of the parts by summing up kinetic energy of all finite elements representing said each of the parts, the kinetic energy of each of the finite elements is calculated using the obtained structural responses together with the corresponding element mass and the added mass contribution for said each of the finite elements.

5. The system of claim 4, wherein the element mass is calculated by multiplying element density with element volume.

6. The system of claim 4, wherein said identifying which finite elements in the FEA model are to receive one or more added mass contributions from the defined nodal lumped masses further comprises checking each nodal point ID defining each of the finite elements to determine whether said each nodal point ID has one of the nodal lumped massed defined.

7. A non-transitory computer readable storage medium containing instructions for reporting realistic kinetic energy of a multi-part finite element analysis (FEA) model by a method comprising:
receiving a finite element analysis (FEA) model in a computer system having a FEA application module installed thereon, the FEA model representing an automobile having a plurality of parts with one or more nodal lumped masses defined therein to ensure realistic mass distribution, wherein the FEA model contains a plurality of finite elements, each of the parts is represented by at least one finite element, and each of the finite elements is associated with an element mass;

identifying, by the FEA application module, which finite elements in the FEA model are to receive one or more added mass contributions from the defined nodal lumped masses;

allocating, by the FEA application module, each of the nodal lumped masses into a plurality of portions in accordance with predefined rules for various sharing situations of the identified finite elements, such that said allocated portions are accumulated as a corresponding added mass contribution to respective ones of the identified finite elements that share said each of nodal lumped masses, wherein the predefined rules are based on a ratio of the element mass and a sum of element masses of all finite elements that share said each of the nodal lumped masses;

obtaining, by the FEA application module, numerically-simulated structural responses of the automobile by conducting a time-marching simulation using the FEA model having the added mass contribution included in the identified finite elements, the structural responses including nodal velocities at each solution cycle; and reporting, by the FEA application module, a total kinetic energy of said each of the parts by summing up kinetic energy of all finite elements representing said each of the parts, the kinetic energy of each of the finite elements is calculated using the obtained structural responses together with the corresponding element mass and the added mass contribution for said each of the finite elements.

8. The non-transitory computer readable storage medium of claim 7, wherein the element mass is calculated by multiplying element density with element volume.

9. The non-transitory computer readable storage medium of claim 7, wherein said identifying which finite elements in the FEA model are to receive one or more added mass contributions from the defined nodal lumped masses further comprises checking each nodal point ID defining each of the finite elements to determine whether said each nodal point ID has one of the nodal lumped massed defined.

* * * * *